United States Patent
Kuo et al.

(10) Patent No.: US 7,973,413 B2
(45) Date of Patent: Jul. 5, 2011

(54) THROUGH-SUBSTRATE VIA FOR SEMICONDUCTOR DEVICE

(75) Inventors: Chen-Cheng Kuo, Chu-Pei (TW); Chen Chen-Shien, Zhubei (TW); Kai-Ming Ching, Jhudong Township, Hsinchu County (TW); Chih-Hua Chen, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 42 days.

(21) Appl. No.: 11/844,650

(22) Filed: Aug. 24, 2007

(65) Prior Publication Data

US 2009/0051039 A1     Feb. 26, 2009

(51) Int. Cl.
*H01L 23/52* (2006.01)
(52) U.S. Cl. .......................... 257/774; 257/706
(58) Field of Classification Search .............. 257/276, 257/280, 773, 774, E23.067, E23.174, 706, 257/796
See application file for complete search history.

(56) References Cited

U.S. PATENT DOCUMENTS

| | | | |
|---|---|---|---|
| 4,814,041 A | | 3/1989 | Auda |
| 5,913,148 A | * | 6/1999 | Hills .............................. 438/701 |
| 5,949,140 A | * | 9/1999 | Nishi et al. .................... 257/728 |
| 5,960,315 A | | 9/1999 | Gambino et al. |
| 6,580,175 B1 | * | 6/2003 | Lee ................. 257/786 |
| 7,081,408 B2 | | 7/2006 | Lane et al. |
| 7,288,481 B2 | * | 10/2007 | Nemoto ........................ 438/667 |
| 2004/0262767 A1 | * | 12/2004 | Matsuo .......................... 257/758 |
| 2006/0091430 A1 | * | 5/2006 | Sriram et al. ................. 257/280 |
| 2006/0180938 A1 | * | 8/2006 | Kurihara et al. ............. 257/773 |
| 2007/0114668 A1 | * | 5/2007 | Goto et al. .................... 257/758 |
| 2007/0132088 A1 | * | 6/2007 | Kariya et al. ................. 257/698 |

* cited by examiner

*Primary Examiner* — Steven Loke
*Assistant Examiner* — Kimberly M Thomas
(74) *Attorney, Agent, or Firm* — Haynes and Boone, LLP

(57) ABSTRACT

A semiconductor device including a substrate having a front surface and a back surface is provided. A plurality of interconnect layers are formed on the front surface and have a first surface opposite the front surface of the substrate. A tapered profile via extends from the first surface of the plurality of interconnect layers to the back surface of the substrate. In one embodiment, a insulating layer is formed on the substrate and includes an opening, and wherein the opening includes conductive material providing contact to the tapered profile via.

15 Claims, 5 Drawing Sheets

THROUGH-SUBSTRATE VIA FOR SEMICONDUCTOR DEVICE

BACKGROUND

The present disclosure relates generally to semiconductor manufacturing and, more particularly, to a tapered profile via and method of fabricating a via including a tapered profile. The tapered profile via is a though-substrate via (also known as a through-silicon via (TSV) or through-wafer via).

Vias have been routinely used in semiconductor fabrication to provide electrical coupling between one or more layers of conductive material within a semiconductor device. More recently, through-silicon vias (TSV) have arisen as a method of overcoming limitations of conventional wire bonding for example, as performance and density requirements increase no longer allowing traditional wire bonding to be adequate. TSV allow for shorter interconnects by forming an interconnect in the z-axis. The interconnect is created through a substrate (e.g. wafer), by forming a via extending from a front surface to a back surface of the substrate. TSV are also useful in forming interconnects for stacked wafers, stacked die, and/or combinations thereof.

The use of TSV technology however creates challenges. The aspect ratio of the via may be quite high (e.g. the thickness of the substrate or the depth of the via is large as compared to the diameter of the via). In conventional processes, the via also has a profile having substantially straight sidewalls. Such a high aspect ratio and straight wall profile and can lead to issues associated with filling (e.g. by depositing or plating) the via with material. For example, issues include poor sidewall coverage, improper seed or barrier layer formation, and/or voids in the metallization fill. Furthermore, conventional methods of forming a via may lead to an undesirable undercut in layers (e.g. undercuts between oxide and silicon) of the substrate.

As such, an improved via and method of fabricating such is desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to semiconductor devices and more particularly, to a tapered profile via and method of fabricating a tapered profile via. It is understood, however, that specific embodiments are provided as examples to teach the broader inventive concept, and one of ordinary skill in the art can easily apply the teaching of the present disclosure to other methods or devices. In addition, it is understood that the methods and apparatus discussed in the present disclosure include some conventional structures and/or processes. Since these structures and processes are well known in the art, they will only be discussed in a general level of detail. Furthermore, reference numbers are repeated throughout the drawings for sake of convenience and example, and such repetition does not indicate any required combination of features or steps throughout the drawings. Moreover, the formation of a first feature over, on, adjacent, or coupled to a second feature in the description that follows may include embodiments in which the first and second features are formed in direct contact, and may also include embodiments in which additional features may be formed interposing the first and second features, such that the first and second features may not be in direct contact. Also, the formation of a feature on a substrate, including for example, etching a substrate, may include embodiments where features are formed above the surface of the substrate, directly on the surface of the substrate, and/or extending below the surface of the substrate (such as, vias). A substrate may include a semiconductor wafer and one or more layers formed on the wafer. A via, as defined herein, may provide a connection between one or more conductive layers (e.g. metal interconnect layers, contact pads including bonding pads) on the substrate, between a conductive layer (e.g. metal interconnect layer) and a semiconductor layer (such as a silicon feature), and/or other desired connections between features formed on or coupled to a substrate. The connection provided by a via may or may not provide an electrical pathway from one feature to another feature. A via may be filled with conductive material, insulating material, and/or other materials used in the art. Furthermore a via may be formed on the substrate including an opening in one or more layers on the substrate, including dielectric layers, metal layers, semiconductor layers, and/or other features known in the art.

Figure 1:
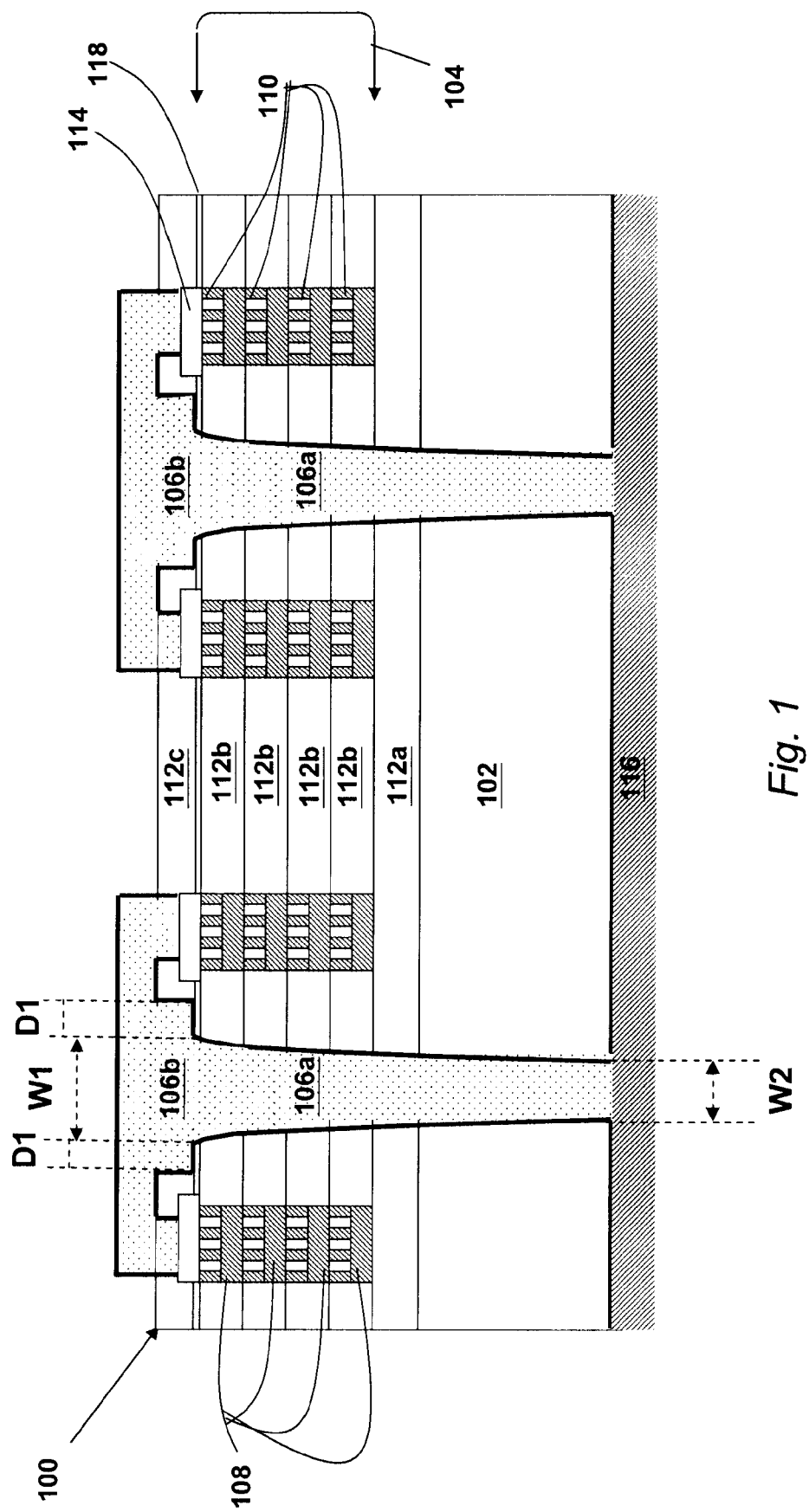
FIG. 1 is a cross-section illustrating an embodiment of a semiconductor device including a plurality of through-substrate vias.

Referring to FIG. 1, illustrated is a semiconductor device 100. The semiconductor device 100 includes a substrate 102. The substrate 102 includes an interconnect structure 104 (e.g. interconnect layers) formed including a plurality of metal layers 108, a plurality of contact vias 110 coupling metal layers 108, and isolation (e.g. dielectric or inter-metal dielectric IMD) layers 112b separating the metallization. An isolation layer 112a is located between the interconnect structure 104 and the substrate 102. An isolation layer 112c is located on the interconnect structure 104. A plurality of contact pads 114 are coupled to the interconnect structure 104. The contact pads 114 are surrounded in part by the isolation layer 112c. A hard mask layer 118 is located overlying the interconnect structure 104. In an alternative embodiment, the hard mask layer 118 is not present. Two tapered profile vias 106a extend from the surface of the 102 to the back surface of the substrate 102. The tapered profile vias 106a include a width W1 that is greater than a width W2. In the illustrated embodiment, a conductive layer 116 is formed on the backside (e.g. surface) of the substrate 102. The tapered profile vias 106a extend from the top surface of the interconnect structure 104 and/or the hard mask layer 118 to the conductive layer 116 on the back surface of the substrate 102. The illustration of the device 100 including two tapered profile vias 106a is exemplary only. A typical device may include hundreds of such vias. The tapered profile vias 106a are coupled to the interconnect structure 104, including by an aperture 106b (e.g. opening) in the insulating layer 112c filled with conductive material. The aperture 106b has a width greater than W1. The aperture 106b is formed by an etch-back of the insulating layer 112c a distance D1 from the opening of the tapered profile via 106a. In an embodiment, the width W1 is approximately 30 µm. In an embodiment, the width W2 is approximately 20 µm. In an embodiment, the distance D1 is approximately 50 µm.

The substrate 102 may include silicon in a crystalline structure. In alternative embodiments, the substrate 102 may include other elementary semiconductors such as germanium, or may include a compound semiconductor such as, silicon carbide, gallium arsenide, indium arsenide, or indium phosphide. The substrate 102 may include a silicon on insulator (SOI) substrate, and/or other isolation structures. The substrate 102 further comprises one or more features formed on the substrate 102. These features, designated front-end of the line (FEOL) features, are not illustrated but may be present on the substrate. The FEOL features may include, for example, gate structures, source/drain regions, other doped regions, isolation structures, contacts to one or more of the gate, source, or drain regions, memory elements (e.g. memory cells), and/or other features known in the art. Typically, these FEOL features are formed on the front surface of the substrate 102. One or more of the FEOL features are electrically coupled to the interconnect structure 104. The interconnect structure 104 may be referred to as a back-end of the line (BEOL) feature. It should be also understood that "front" and "back" such as the front surface of the substrate and the back surface of the substrate, as used herein are arbitrary and the surfaces of the substrate may be referenced by any suitable convention.

The isolation layer 112a and the plurality of inter-metal isolation layers 112b comprise an isolation material. The layer 112c also comprises an isolation material. The isolation material is such that it comprises a low dielectric constant. The inter-metal isolation layers 112b may provide for minimized capacitive coupling between the metal traces (e.g. interconnect lines) in the interconnect structure. The isolation layer 112a may provide isolation for one or more features formed on the substrate 102 and/or isolation of a first metal layer 108. The isolation layer 112c may provide isolation of the pads 114, interconnect region 106b, and/or the tapered profile vias 106a. In an embodiment, one or more of the isolation layer 112a, the inter-metal isolation layers 112b, and the isolation layer 112c include silicon oxide. Examples of other materials that may be suitable as an isolation material include, tetraethylorthosilicate (TEOS) oxide, un-doped silicon glass, or doped silicon oxide such as borophosphosilicate glass (BPSG), fused silica glass (FSG), phosphosilicate glass (PSG), boron doped silicon glass (BSG), SILK (a product of Dow Chemical of Michigan), BLACK DIAMOND (a product of Applied Materials of Santa Clara, Calif.), and/or other insulating materials known in the art. The isolation layers 112a, 112b, 112c may be formed by conventional processes such as, chemical vapor deposition (CVD), atomic layer deposition (ALD), physical vapor deposition (PVD), spin-on coating, and/or other processes known in the art. The isolation layer 112c may be approximately 10 µm in thickness.

The interconnect structure 104 of the device 100 as illustrated includes four metal layers 108; however any number of metal layers are possible. The metal layers 108 and vias 110 comprise conductive material. The metal layers 108 and vias 110 may include conductive material such as, copper, aluminum, tungsten, tantalum, titanium, nickel, cobalt, metal silicide, metal nitride, polysilicon, gold, silver, and/or other conductive materials possibly including one or more refractory layers or linings. The metal layers 108 and/or vias 110 may be formed using conventional processes such as, CVD, PVD, ALD, plating, and/or other processes known in the art. The pads 114 provide electrical contact to the interconnect structure 104. The pads 114 may include for example, aluminum, copper, titanium, tungsten, gold, and/or other conductive materials known in the art. The hard mask layer 118 may include an oxide (such as silicon oxide), a nitride (such as silicon nitride $S_3N_4$, silicon oxynitride), silicon carbide, and/or other suitable dielectric materials. In an embodiment, the hard mask layer is approximately 0.2 µm in thickness.

The tapered profile vias 106a as illustrated are through-substrate vias extending from a surface of the hard mask layer 118 to a back surface of the substrate 102. In other embodiments, the tapered profile vias 106a may extend from the interconnect structure 104, a front surface of the substrate 102, the isolation layer 112c, and/or from other features of the substrate 102. A conductive layer 116 is formed on the back surface of the substrate 102. The tapered profile vias 106a may be coupled to the conductive layer 116. The conductive layer 116 may have a composition including aluminum, copper, nickel and/or other conductive materials known in the art. In an embodiment, the conductive layer 116 is formed by conventional plating processes. In an embodiment, the conductive layer 116 is formed by electroless nickel immersion gold (ENIG) process. The conductive layer 116 may provide electrical contact to the device 100 from a surrounding environment. The tapered profile vias 106a may be formed using the method 200, described below with reference to FIG. 2. The tapered profile vias 106a may include copper, aluminum, tungsten, tantalum, titanium, nickel, cobalt, metal silicide, metal nitride, polysilicon, gold, silver, and/or other conductive materials. In an embodiment, the tapered profile vias 106a may include one or more coating layers of insulating material such as, silicon oxide, silicon nitride, and/or other suitable insulating materials. In an embodiment, the tapered profile vias 106a may include a seed layer, such as a copper seed layer, prior to filling the via with conductive material. In an embodiment, the tapered profile via 106a may include barrier and/or adhesion layers, such as, a TaN layer. The aperture 106b may be filled with conductive material as well as barrier layers, adhesive layers, and/or insulating material layers substantially similar to the tapered profile vias 106a described above.

In the illustrated embodiment, the tapered profile vias 106a are formed after the formation of the FEOL devices and the interconnect structure 104. In other embodiments, one or more through-substrate vias, such as the tapered profile vias 106a, may be formed prior to the formation of FEOL features on the substrate 102. For example, in an embodiment a tapered profile via may be formed prior to the formation of a transistor.

Figure 2:
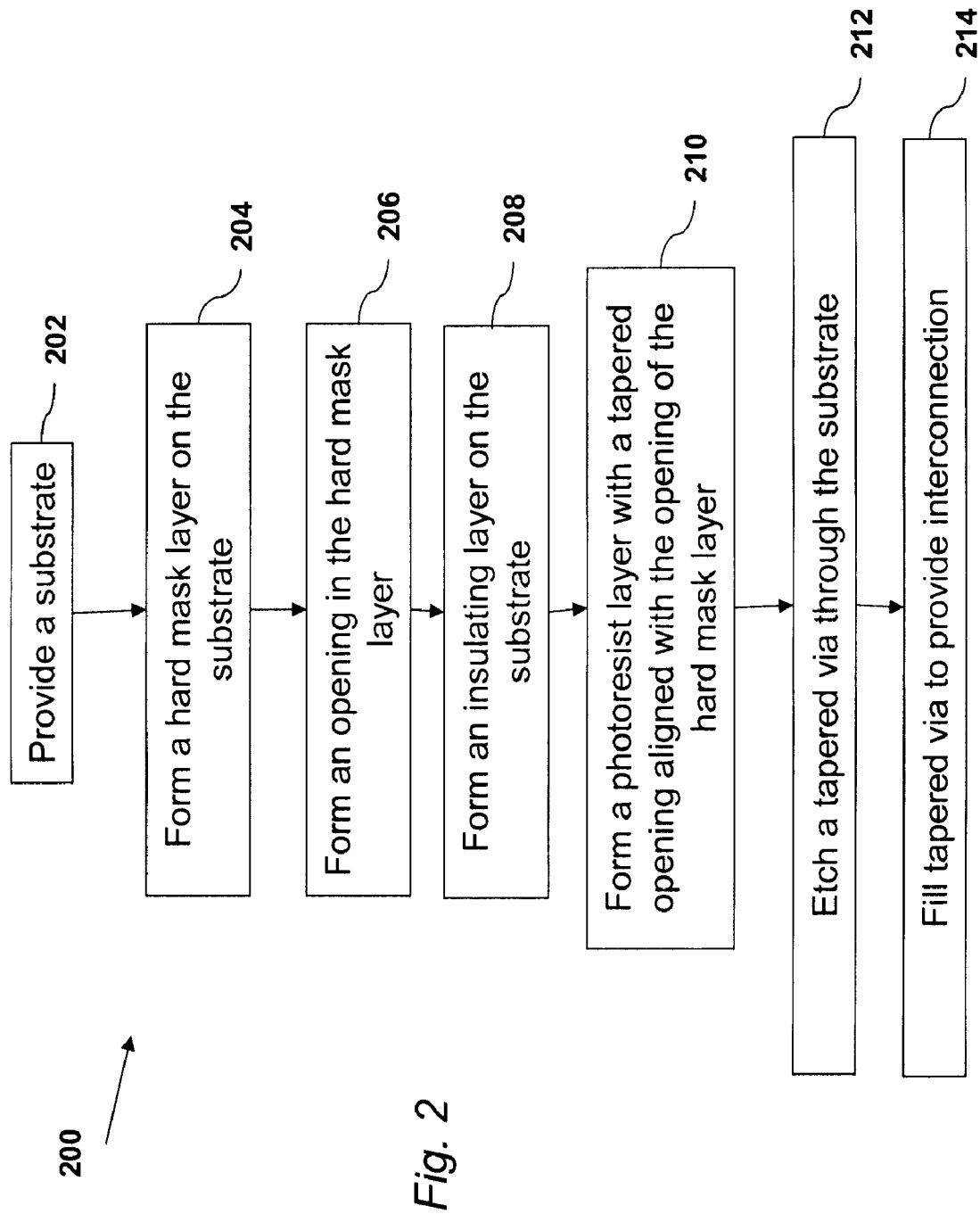
FIG. 2 is a flow-chart illustrating an embodiment of a method of fabricating a through-silicon via having a tapered profile.
Figure 3:
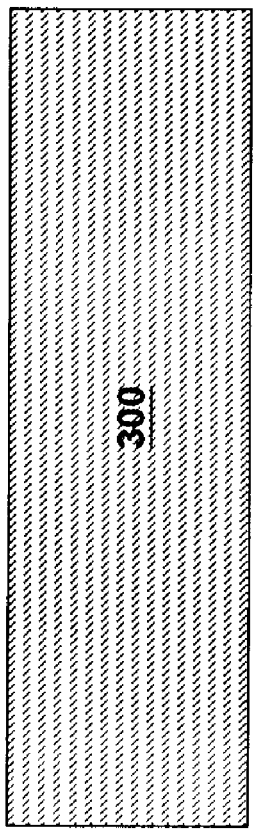
FIGS. 3, 4, 5, 6, and 7 are cross-sections illustrating an embodiment of the steps of method of FIG. 2.
Figure 4:
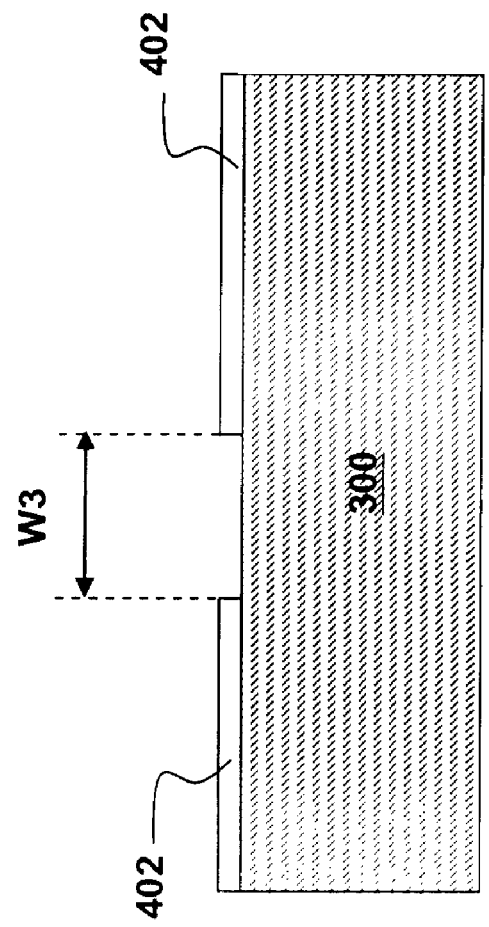
Figure 5:
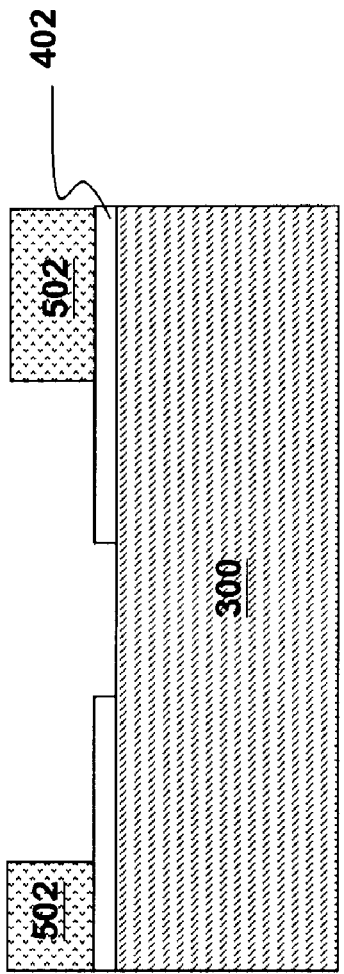

Referring now to FIG. 2, illustrated is a method 200 of fabricating a via having a tapered profile. FIGS. 3, 4, 5, 6, and 7 illustrate an embodiment of modifications of a substrate 202 corresponding to the steps of the method of FIG. 2.

The method 200 begins at step 202 where a substrate is provided. The substrate provided may be substantially similar to the substrate 102, described above with reference to FIG. 1. The substrate has a front surface and a back surface. In an embodiment, the substrate includes at least one feature formed on the front surface of the substrate. Such a feature may include device features such as, a gate structure, a source/drain region, a memory element, and/or other device features known in the art. An interconnect structure, such as the interconnect structure 104 described above with reference to FIG. 1, may also be formed on the front surface of the substrate. The interconnect structure includes at least one metallization layer. The substrate further includes at least one contact pad; the contact pad may be substantially similar to the pad 114, described above in reference to FIG. 1. The contact pad may provide electrical contact to the interconnect structure. In an embodiment, the substrate 102 includes features designed such that the layout of the features allow for a via to be formed through the substrate without interference with a feature's structure or function. In an alternative embodiment, the layout may be such that vias may be formed through the substrate on areas of natural exclusion of features, such as peripheral bond pad areas. In an embodiment, the substrate provided may be thinned prior to, or after the formation of, one or more features. Referring to the example of FIG. 3, the substrate 300 is provided. Though not illustrated, as discussed above, the substrate 300 may include a plurality of device features such as transistors. The substrate 300 may include a plurality of FEOL features and BEOL features. In an embodiment, the substrate 300 has a thickness of approximately 200 μm.

The method 200 then proceeds to step 204 where a hard mask layer is formed on the substrate. The hard mask layer may include an oxide (such as silicon oxide), a nitride (such as silicon nitride $S_3N_4$, silicon oxynitride), silicon carbide, and/or other suitable dielectric materials. The hard mask layer formed by chemical vapor deposition (CVD), physical vapor deposition (PVD), atomic layer deposition (ALD), and/or other processes known in the art. In an embodiment, the hard mask layer is approximately 0.2 μm in thickness.

The method 200 then proceeds to step 206 where an opening is formed in the hard mask layer. The width of the opening may determine a width of a through-substrate via. The opening may expose the underlying substrate layer. The opening may be formed by conventional methods. In an embodiment, photoresist (positive resist or negative resist) is spin coated on the formed hard mask layer. The photoresist layer is then patterned by exposure, bake, developing, and/or other photolithography processes known in the art to provide an opening in the photoresist exposing the hard mask layer. The exposed hard mask layer is then etched, by a wet etch or dry etch process, using the patterned resist as a masking element. In an embodiment, the hard mask layer opening is etched using a reactive ion etch (RIE). After etching an opening in the hard mask layer, the photoresist is stripped from the substrate. Referring to the example of FIG. 4, a hard mask layer 402 is formed on the substrate 300. The hard mask layer 402 includes an opening having a width W3. In an embodiment, W3 is approximately 20 μm.

The method 200 proceeds to step 208 where an insulating layer is formed on the hard mask layer. In an embodiment, the insulating layer includes silicon oxide. In alternative embodiments, the insulating layer may include other suitable low dielectric constant materials. The insulating layer may be substantially similar to the layer 112c, described above with reference to FIG. 1. The insulating layer may provide isolation for an interconnect structure, a contact pad (such as the pad 114 described above with reference to FIG. 1), and/or an interconnect providing contact from a pad to a through-substrate via. The insulating layer may be patterned and etched such that it is etched back from the opening of the hard mask layer formed in reference to step 206. In an embodiment, the insulating layer may be such that it is etched back approximately 50 μm from the hard mask opening creating an opening (e.g. aperture). Referring to the example of FIG. 5, the insulating layer 502 is formed on the substrate 300. In an embodiment, the insulating layer 502 is silicon oxide. In an embodiment, the hard mask layer 402 functions as an etch stop layer when etching the insulating layer 502.

Figure 6:
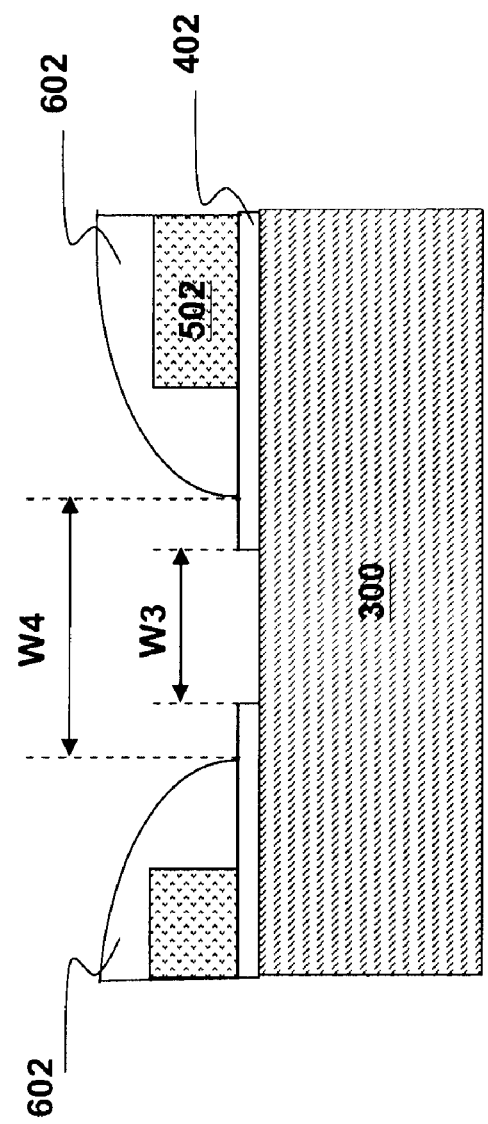

The method 200 proceeds to step 210 where a photoresist layer is formed on the substrate. The photoresist layer is formed such that it has a tapered opening. The tapered opening is aligned with (e.g. overlaps with, is approximately concentric with) the opening of the hard mask layer. The tapered opening has a width greater than that of the opening of the hard mask layer. The tapered opening width may be determinative of a width of a through-silicon via etched using the photoresist layer as a masking element. The photoresist layer may include negative or positive resist. The photoresist layer may be formed on the substrate by spin on coating. In an embodiment, the photoresist layer is approximately 5.5 μm in thickness. In an embodiment, a heat treatment (e.g. bake) is performed on the photoresist layer including an exposure to above 100 degrees Celsius (C) to provide a tapered edge at an opening in the photoresist layer. This heat treatment may allow the photoresist to flow at the edges and provide a tapered profile. In a further embodiment, the heat treatment includes a bake at approximately 130 C. In an embodiment, the heat treatment is performed during the soft bake process of the lithography process. Other manners of forming a tapered resist profile may also be utilized such as, a suitable determination of exposure and development parameters, forming sub-resolution and/or other features on the photolithography mask forming the opening in the photoresist, and/or other methods. The photoresist layer may then be exposed, developed, and/or baked (e.g. post exposure bake PEB) to provide a masking element including the tapered opening. Referring to the example of FIG. 6, the photoresist layer 602 is formed on the substrate 300. The photoresist layer 602 includes a tapered opening having a width W4. The width W4 is greater than the width W3, which is the width of the hard mask layer 402. FIG. 6 also illustrates the alignment of the opening of the hard mask layer 402 and the opening of the photoresist layer 602 such that the substrate 300 is exposed. The photoresist layer 602 and the hard mask 402, including their respective openings, form an etching mask for the formation of a through-silicon via as described below.

The method 200 then proceeds to step 212 where a via (e.g. an opening, an aperture) is etched in the substrate. The trench is etched using the hard mask layer, formed above with reference to steps 204 and 206, and the photoresist layer, formed above with reference to step 210, as masking elements. The through-substrate via may be etched using any suitable etching method including, for example, a plasma etch, a chemical wet etch, and/or other processes known in the art. In an embodiment, the etch includes a deep reactive ion etching (RIE) process to etch the substrate. The etch may be such that a via is etched from the front surface to the back surface of the substrate. In an embodiment, the via may be approximately 200 μm in depth. The etching may result in a through-substrate via having a tapered profile due to the etching mask of the hard mask layer and the tapered photoresist layer. The width (e.g. diameter) of the via at the back surface of the substrate may be substantially similar to the width of the opening in the hard mask layer. The width (e.g. diameter) of the via at the front surface of the substrate may be substantially similar to the width of the tapered opening of the photoresist layer. In an embodiment, the width of the via at the front surface of the substrate may be approximately 30 μm. In an embodiment, the width of the via at the back surface of the substrate may be approximately 20 μm. In an embodiment, the walls of the via are tapered from a width of 30 μm to a width of 20 μm. The hard mask layer exposed in the photoresist layer opening may be removed by the etch. After the trench is etched, the photoresist layer is stripped (e.g. removed) from the substrate.

Figure 7:
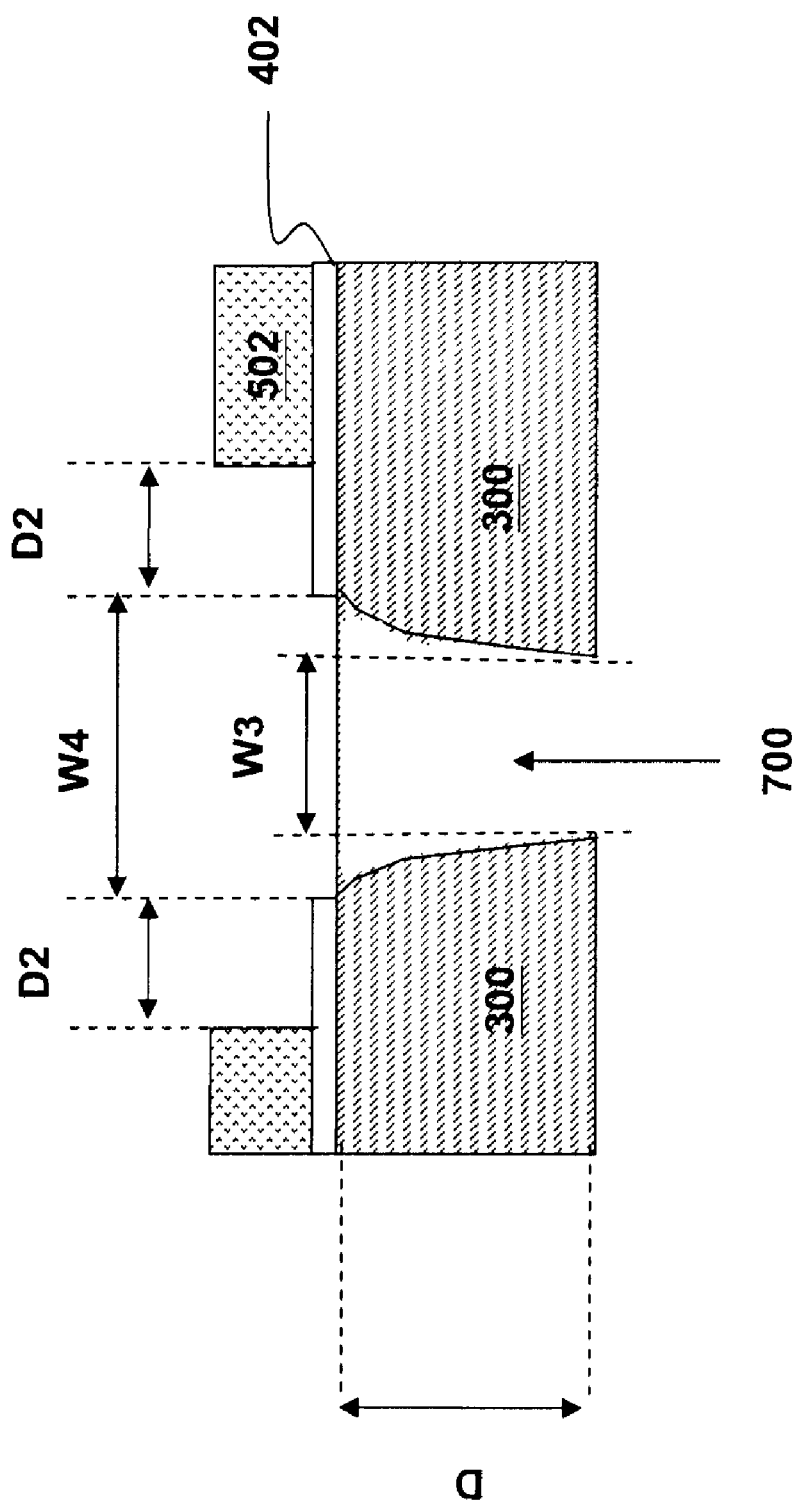

Referring to the example of FIG. 7, the through-substrate via 700 is formed. The via 700 includes a tapered profile. The via 700 includes a width W4 at the front surface of the substrate 300 that is greater than the width W3 at the back surface of the substrate 300. The width W4 is the width of the photoresist layer 602 opening described above with reference to FIG. 6. The width W3 is the width of the hard mask layer 402 opening described above with reference to FIG. 4. In an embodiment, the width W4 is approximately 30 µm. In an embodiment, the width W3 is approximately 20 µm. A portion of the hard mask layer 402 has been removed in the etching of via 700. In particular, the hard mask layer 402 present within the width W4 of the photoresist 602 opening, described above with reference to FIG. 6, has been removed. The photoresist layer 602, described above also with reference to FIG. 6, has been stripped from the substrate 300. The via 700 includes a depth D. In an embodiment, the depth D is approximately 200 µm. The distance D2 (e.g. of etch-back) associated with the insulating layer 502 may be 50 µm.

The method 200 then proceeds to step 214 where the through-substrate via having a tapered profile is coated and/or filled. In an embodiment, the walls, having a tapered profile, of the through-substrate via are coated with an insulating material. The insulating material may include silicon dioxide ($SiO_2$), silicon nitride ($Si_3N_4$), and/or other suitable dielectric materials known in the art. The insulating material may provide isolation of the conductive material formed in the via from one or more features present on the substrate. The insulating layer may be grown, such as by thermal oxidation, or deposited, such as by CVD, in the via.

The via may then be filled with conducting material such that it is operable to provide electrical coupling to one or more interconnects which provide coupling to one or more other device features on the substrate. In an embodiment, a seed layer may first be formed, such as a seed layer including copper. In an embodiment, one or more adhesion promotion layers may be formed. In an embodiment, a diffusion barrier layer may be formed in the via such as, a layer including TaN. The via may be filled with conducting material such as, copper, aluminum, tungsten, tantalum, titanium, nickel, cobalt, metal silicide, metal nitride, polysilicon, and/or other suitable materials. In an embodiment, the via is filled with conducting material using a plating process. Other examples of methods for filling the via include sputtering or PVD, CVD processes, and/or other deposition processes known in the art.

The method 200 may continue to further process steps such as chemical mechanical polish, wafer thinning, further metallization processes to provide interconnections, and/or other processes known in the art.

Though the foregoing discussion has been associated with the fabrication of a via that extends through a substrate (e.g. a through-substrate via), one skilled in the art will readily recognize that the methods described below may be useful in fabricating any via on a substrate.

Thus provided is a semiconductor device including a substrate having a front surface and a back surface. A plurality of interconnect layers are formed on the front surface and have a first surface opposite the front surface of the substrate. A tapered profile via extending from the first surface of the plurality of interconnect layers to the back surface of the substrate.

Also provided is a device including a substrate having a front surface and a back surface. A plurality of interconnect layers are formed on the front surface and have a first surface opposite the front surface of the substrate. An insulating layer is formed on the first surface of the plurality of interconnect layers. The insulating layer includes an aperture. An interconnect structure is formed on the substrate including the aperture in the insulating layer and a tapered profile via extending from the aperture in the insulating layer to the back surface of the substrate, wherein the aperture and the tapered profile via include conductive material.

Furthermore, provided is a device including a substrate having a front surface and a back surface. The substrate includes a plurality of device features. An insulating layer is formed on the front surface of the substrate having an opening of a first width. The opening of the first width is filled with conductive material. A tapered profile via extends from the front surface of the substrate to the back surface of the substrate. The tapered profile via has a second width at the front surface of the substrate and a third width at the back surface of the substrate. The first width is greater than the second width, and the second width is greater than the third width.

What is claimed is:

1. A semiconductor device, comprising:
   a semiconductor substrate having a front surface and a back surface;
   an interconnect structure formed on the front surface of the semiconductor substrate, and wherein the interconnect structure has a first surface opposite the front surface of the semiconductor substrate, and wherein the interconnect structure includes a first conductive layer, a second conductive layer overlying the first conductive layer, and an isolation layer interposing the first conductive layer and the second conductive layer;
   a hard mask layer formed on the interconnect structure;
   an insulating layer formed directly on the hard mask layer; and
   a tapered profile via extending from the hard mask layer to the back surface of the semiconductor substrate, wherein the tapered profile via is substantially filled with conductive material.

2. The device of claim 1, wherein the tapered profile via has a coating layer formed on the sidewalls of the tapered profile via, and the remainder of the tapered profile via is filled with conductive material.

3. The device of claim 1, wherein the hard mask layer includes a material selected from the group consisting of an oxide, a nitride, and a carbide.

4. The device of claim 1, wherein the hard mask layer includes a thickness of approximately 0.2 µm.

5. The device of claim 1, wherein the tapered profile via includes a first width at the first surface of the interconnect structure and a second width at the back surface of the semiconductor substrate, and wherein the second width is less than the first width.

6. The device of claim 1, wherein sidewalls of the tapered profile via are directly adjacent a plurality of insulating layers of the interconnect structure.

7. The device of claim 1, wherein the semiconductor substrate includes at least one device feature formed on the front surface.

8. The device of claim 1, wherein the insulating layer includes an opening having substantially vertical sidewalls, and wherein the opening includes conductive material contacting the tapered profile via.

9. The device of claim 8, wherein the insulating layer includes an oxide material.

10. The device of claim 8, wherein the insulating layer is approximately 10 µm in thickness.

11. The device of claim 5 wherein the insulating layer is etched back from a region overlying the tapered profile via providing an opening of a third width, wherein the third width is greater than the first width, and wherein the opening has substantially vertical sidewalls, wherein the vertical sidewalls define the third width.

12. A device, comprising:
a semiconductor substrate having a semiconductor device feature and an interconnect structure electrically coupled to the semiconductor device feature; wherein the semiconductor substrate includes a top surface and a back surface opposing the top surface, wherein the interconnect structure lies above the top surface, and wherein the interconnect structure includes conductive lines electrically coupled by conductive vias;
an insulating layer formed on the top surface of the semiconductor substrate having an opening having substantially vertical sidewalls, wherein the vertical sidewalls define a first width, wherein the opening of the first width is filled with conductive material;
a tapered profile via extending from the top surface of the semiconductor substrate to the back surface of the semiconductor substrate, wherein the tapered profile via has a second width at the top surface of the semiconductor substrate and a third width at the back surface of the semiconductor substrate, and wherein the first width is greater than the second width, and the second width is greater than the third width, and wherein the opening of the insulating layer is in contact with the tapered profile via.

13. The device of claim 12, wherein first width is approximately 130 μm, the second width is approximately 30 μm, and the third width is approximately 20 μm.

14. The device of claim 12, further comprising a hard mask layer formed on the top surface of the semiconductor substrate and underlying the insulating layer.

15. The device of claim 14, where the hard mask layer includes an opening having approximately the second width.

* * * * *